United States Patent [19]

Miller et al.

[11] Patent Number: 5,787,457
[45] Date of Patent: Jul. 28, 1998

[54] CACHED SYNCHRONOUS DRAM ARCHITECTURE ALLOWING CONCURRENT DRAM OPERATIONS

[75] Inventors: Christopher Paul Miller, Underhill; Jim Lewis Rogers, Milton; Steven William Tomashot, Williston, all of Vt.

[73] Assignee: International Business Machines Corporation, Armonk, N.Y.

[21] Appl. No.: 731,790

[22] Filed: Oct. 18, 1996

[51] Int. Cl.$^6$ .................................................. G06F 12/08
[52] U.S. Cl. ........................... 711/105; 711/118; 711/168
[58] Field of Search ................................. 711/105, 118, 711/119, 117, 168

[56] References Cited

U.S. PATENT DOCUMENTS 5,184,320  2/1993  Dye .................................................. 365/49
5,588,130  12/1996  Fujishima et al. ........................ 711/118

Primary Examiner—Eddie P. Chan
Assistant Examiner—Hiep T. Nguyen
Attorney, Agent, or Firm—Robert A. Walsh

[57] ABSTRACT

A cached synchronous dynamic random access memory (cached SDRAM) device having a multi-bank architecture includes a synchronous dynamic random access memory (SDRAM) bank including a row decoder coupled to a memory bank array for selecting a row of data in the memory bank array, sense amplifiers coupled to the memory bank array via bit lines for latching the row of data selected by the row decoder, and a synchronous column select means for selecting a desired column of the row of data. A randomly addressable row register stores a row of data latched by the sense amplifiers. A select logic gating means, disposed between the sense amplifiers and the row register, selectively gates the row of data present on the bit lines to the row register in accordance to particular synchronous memory operations of the cached SDRAM being performed. Data to be input into the cached SDRAM during a Write operation is received by the sense amplifiers and written into the memory bank array. Data to be output from the cached SDRAM during a Read command is read out only from the row register, the row of data contained in the row register first having been read from the memory bank array to the sense amplifiers and then selectively gated to the row register in accordance with the particular synchronous memory operations.

9 Claims, 13 Drawing Sheets

| FIG. 1A | FIG. 1B |

| FIG. 3A |
| FIG. 3B |

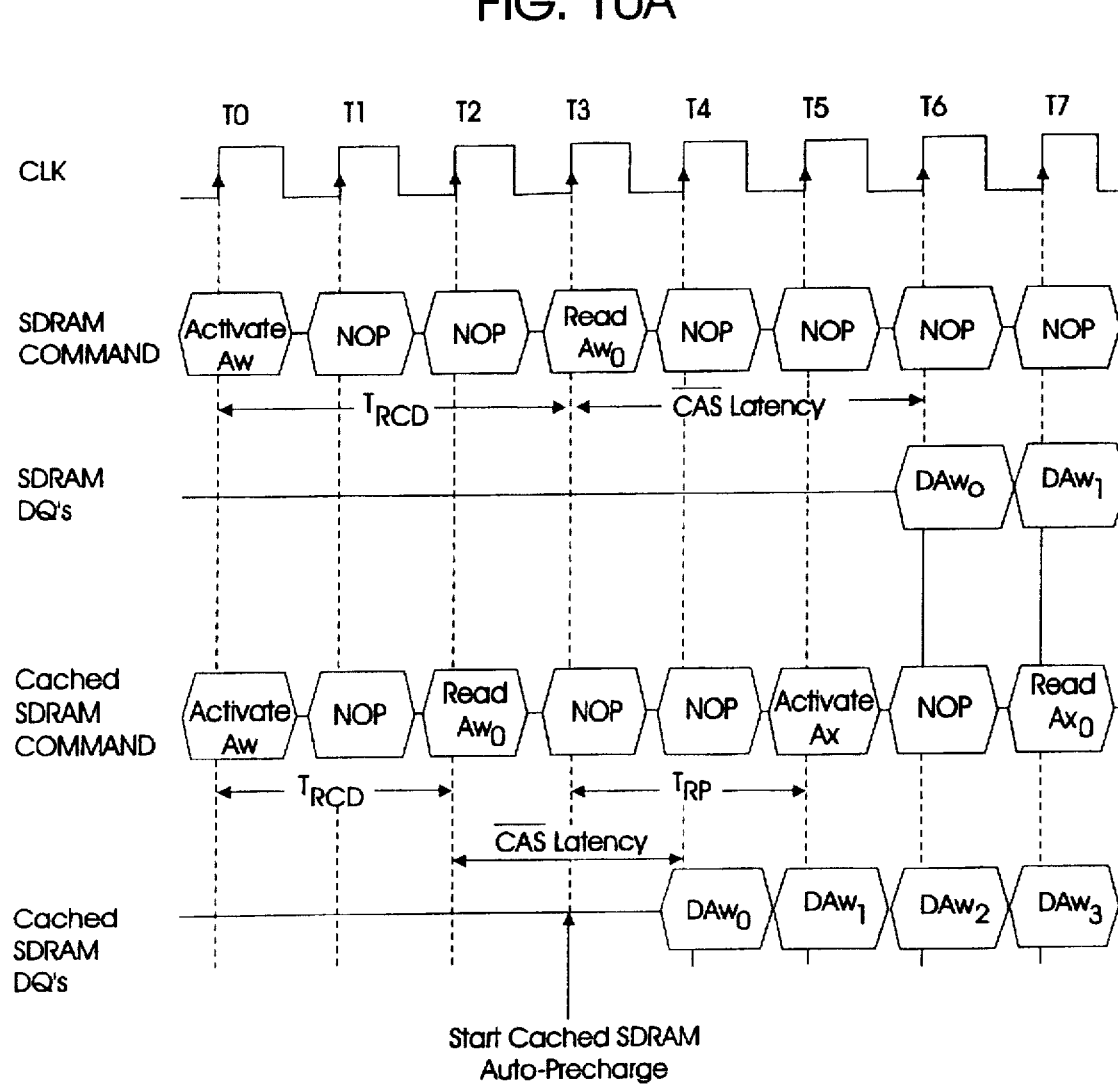

CACHED SYNCHRONOUS DRAM ARCHITECTURE ALLOWING CONCURRENT DRAM OPERATIONS

BACKGROUND OF THE INVENTION

1. Field of the Invention

This invention relates generally to synchronous dynamic random access memory (SDRAM) devices and, more particularly, to a cached SDRAM.

2. Discussion of the Related Art

Turning now to FIG. 1, a block diagram of a standard SDRAM is shown, in particular, a 2 Mbit×4 I/O×2 Bank SDRAM. Other configurations of SDRAMs are also known (e.g., 1 Mbit×8 I/O×2 Bank, 512 Mbit×16 I/O×2 Bank, etc.). The typical SDRAM 10 includes an address buffer 12, first and second memory banks (14A, 14B) and corresponding row decoders (16A, 16B), column decoders (18A, 18B), sense amplifiers (20A, 20B), and data latches (22A, 22B). Data input/output buffers 24 receive data to be written into a memory array (i.e., either array 14A or 14B) and output data read from a memory array (i.e., either array 14A or 14B).

An externally supplied system clock(CLK) signal is input to a clock buffer 26(CLK Buffer), the CLK signal for providing system timing for the various function blocks of the SDRAM 10. SDRAM 10 inputs are sampled on the rising edge of the CLK signal. An externally supplied clock enable signal (CKE) is input to a clock enable buffer 28(CKE Buffer). The CKE buffer 28 provides an enable output to the CLK Buffer 26 and to a Self Refresh Clock 30. CKE activates the CLK signal when in a high state and deactivates the CLK signal when low. By deactivating the clock, CKE low initiates a Power Down mode, Suspend mode, or a Self Refresh mode. The Self Refresh Clock 30 and a Row Address Counter 32 operate in a standard manner for implementing the Self Refresh mode.

Address buffer 12 receives address inputs, A0–A11, and outputs information via address data lines 34 to the command decoder 36, row decoders (16A, 16B), column decoders (18A, 18B), sequential controls (38A, 38B) and mode register 40. The data input/output buffer 24 provides input/outputs, corresponding to DQ0–DQ3.

The command decoder 36 outputs appropriate command signals for executing a desired operation of the SDRAM 10, in accordance with input signals which it receives. Examples of typical SDRAM operations include a Read operation and a Write operation. During a Read operation, upon the receipt of a Read command, the SDRAM 10 reads data from a particular memory location specified by the address received on the address lines. Similarly, during a Write operation, the SDRAM writes data received on the data input/output (I/O) lines DQ0–DQ3 into a particular memory location specified by the address received on the address lines. In conjunction with the carrying out of SDRAM operations, the command decoder 36 receives buffered inputs including a chip select (CS), row address strobe (RAS), column address strobe (CAS), write enable (WE), and a bank select (BS) input. In accordance with a first operation, the command decoder 36 provides a command signal to the row address counter 32 for performing a self refresh operation. In accordance with other operations, the command decoder 36 provides command signals to a mode register 40, row/column select blocks (16A, 16B) for each memory bank (14A, 14B), and sequential control blocks (38A, 38B) for each memory bank, as appropriate for carrying out the desired synchronous memory operation wherein the synchronous memory operation corresponds to a standard SDRAM command decoded by the command decoder on a rising or falling clock edge. The mode register 40, for instance, provides a control signal to a respective sequential control (38A, 38B) of each memory bank (14A, 14B). The sequential control for each memory bank controls respective data latches associated with the respective memory bank. The Mode Register 40 receives input data via address buffer 12 for programming the operating mode, CAS Latency, burst type (BT), and burst length as shown in FIG. 2. The row/column select (42A, 42B) for each memory bank (14A, 14B) controls respective row decoders (16A, 16B) and column decoders (18A, 18B) associated with the respective memory bank (14A, 14B). A buffered data mask input (DQM) is connected to the data input/output buffers 24 for selectively masking all or none of the data inputs or data outputs of the SDRAM chip 10. Specific implementations for Read, Write, Refresh, and other typical operations of the SDRAM, as shown in FIG. 1, are known in the art and not further discussed herein.

As discussed above, synchronous DRAM products are generally known in the art. Industry standards for SDRAMs have been established, i.e., electrical and mechanical. Included in the standards for 16 Mbit synchronous DRAM products, for example, is a requirement that all of the control, address and data input/output circuits are synchronized with the positive edge of an externally supplied clock. Additionally, prior to any access operation, the CAS latency, burst length, and burst sequence must be programmed into the device by address inputs A0–A9 during a Mode Register Set cycle.

While standard synchronous DRAMs are designed to be flexible through programmability and to provide higher burst rates not achievable with asynchronous DRAMs, unfortunately, a standard SDRAM does not improve the initial latency of a page hit or miss. A page hit occurs during a read cycle when the row being accessed is already being sensed by the sense amplifiers and the memory array or bank is open. A page miss occurs during a read cycle when the row being accessed is not currently being sensed by the sense amplifiers, wherein the memory bank must first be closed, reactivated, refreshed, and reopened. Furthermore, the standard SDRAM does not reduce the penalties caused by the DRAM cycle time ($t_{RC}$) and the DRAM precharge time ($t_{RP}$). With multiple memory banks, a standard SDRAM does allow the user to perform simultaneous operations on both memory banks in order to hide some of the precharge and cycle time delays. However, this feature is only useful if the data being stored is orderly and can be organized such that the SDRAM can ping-pong between the two open banks uninterrupted. With today's multi-tasking computer operating systems, this is a formidable task. Standard SDRAMs thus suffer some performance limitations including, for instance, an inability to fully utilize the memory bandwidth and further having undesirable system wait states for all memory accesses.

SUMMARY OF THE INVENTION

An object of the present invention to solve performance issues of standard SDRAMs by reducing the latency of the memory and allowing simultaneous operations to occur on the same memory bank, that is, using a single memory bank of a multi-bank device.

Another object of the present invention is to enable a full utilization of memory bandwidth and to eliminate system wait states for all memory accesses.

According to the present invention, a cached synchronous dynamic random access memory (cached SDRAM) device having a multi-bank architecture includes a synchronous dynamic random access memory (SDRAM) bank, a randomly addressable row register, and a select logic gating means. The SDRAM includes a row decoder coupled to a memory bank array for selecting a row of data in the memory bank array, sense amplifiers coupled to the memory bank array via bit lines for latching the row of data selected by the row decoder, and a synchronous column select means for selecting a desired column of the row of data. The row register stores a row of data latched by the sense amplifiers. The select logic gating means, disposed between the sense amplifiers and the row register, selectively gates the row of data present on the bit lines to the row register in accordance a particular synchronous memory operation of the cached SDRAM being performed. Data to be input into the cached SDRAM during a Write operation is received by the sense amplifiers and written into the memory bank array. Data to be output from the SDRAM during a Read operation is read out only from the row register, the row of data contained in the row register first having been read from the memory bank array to the sense amplifiers and then selectively gated to the row register in accordance with the particular synchronous memory operation.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

Because dynamic random access memories (DRAMs), and more particularly, synchronous DRAMs are known in the art, the present invention shall be described in particular to elements forming part of, or cooperating directly with, the invention. It is to be understood, however, that other elements not specifically shown or described may take various forms known to persons of ordinary skill in the semiconductor memory art. In addition, for clarity purposes, the present invention shall be described with respect to a 16 Mbit SDRAM (2 Mbit×4 I/O×2 Bank). Other SDRAM densities, organizations, and bank quantities are possible.

Figure 1A:
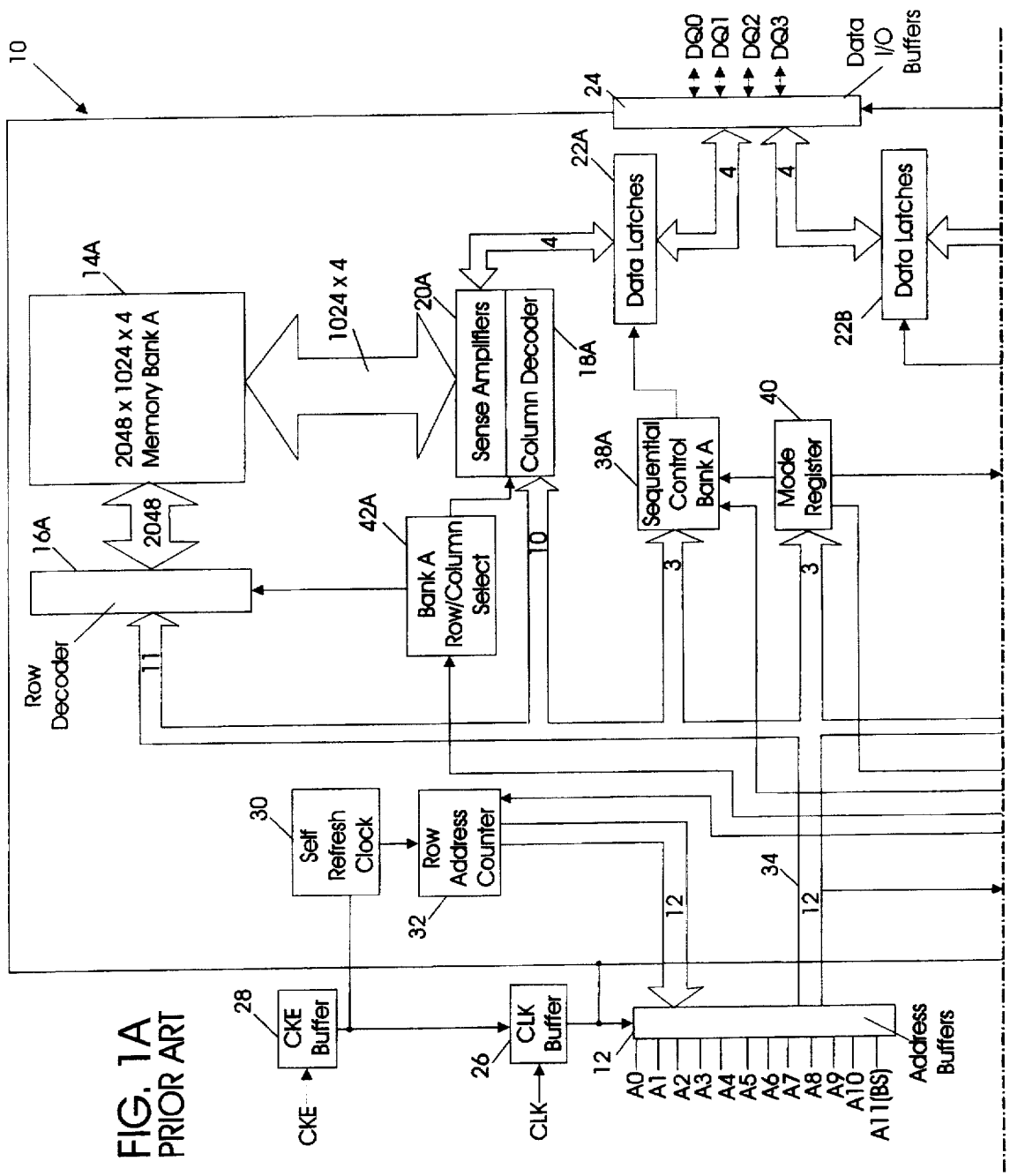
FIG. 1 shows a block diagram of a known (2 Mbit×4 I/O×2 Bank)synchronous dynamic random access memory device.
Figures 1, 1B:
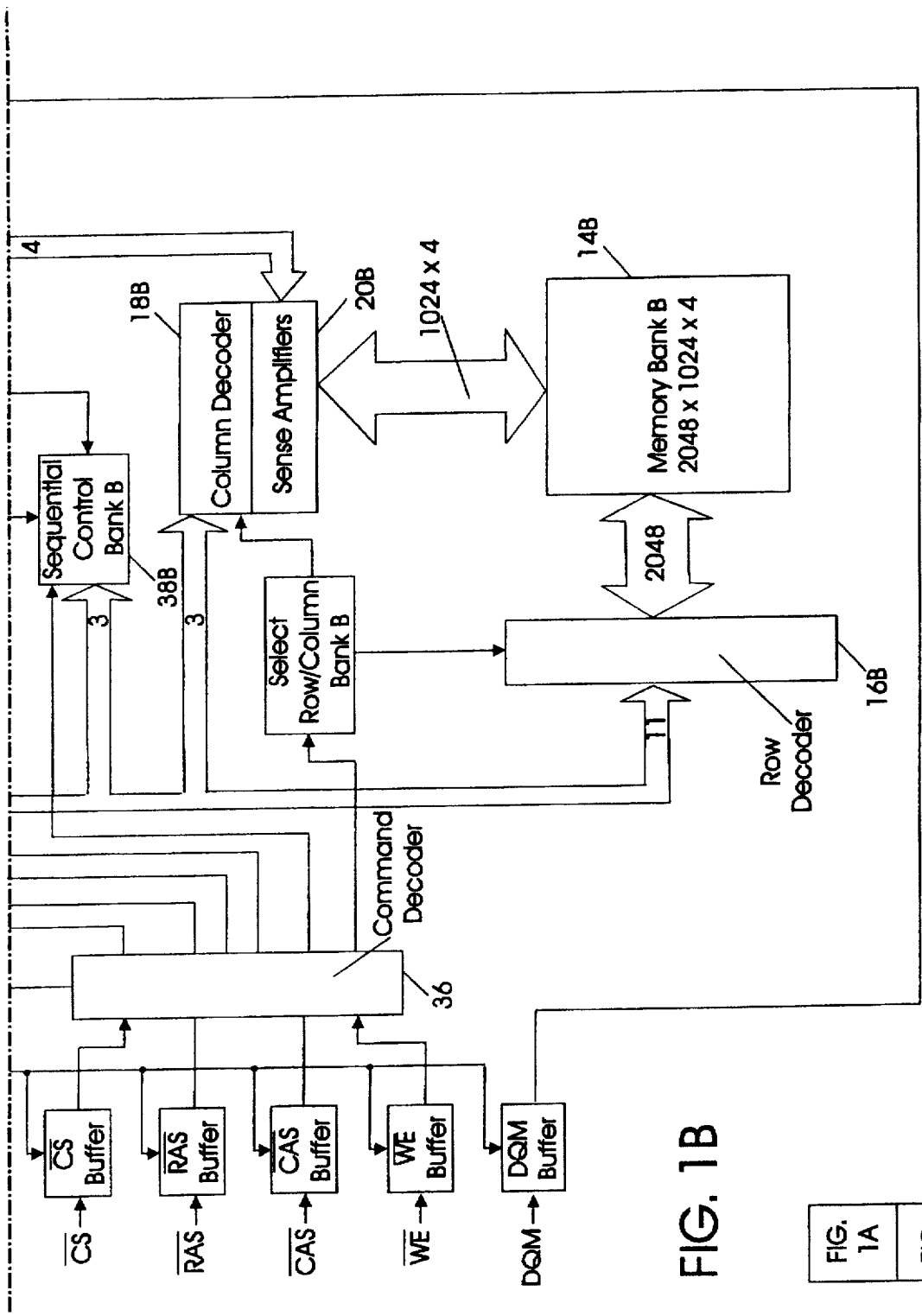
Figure 2:
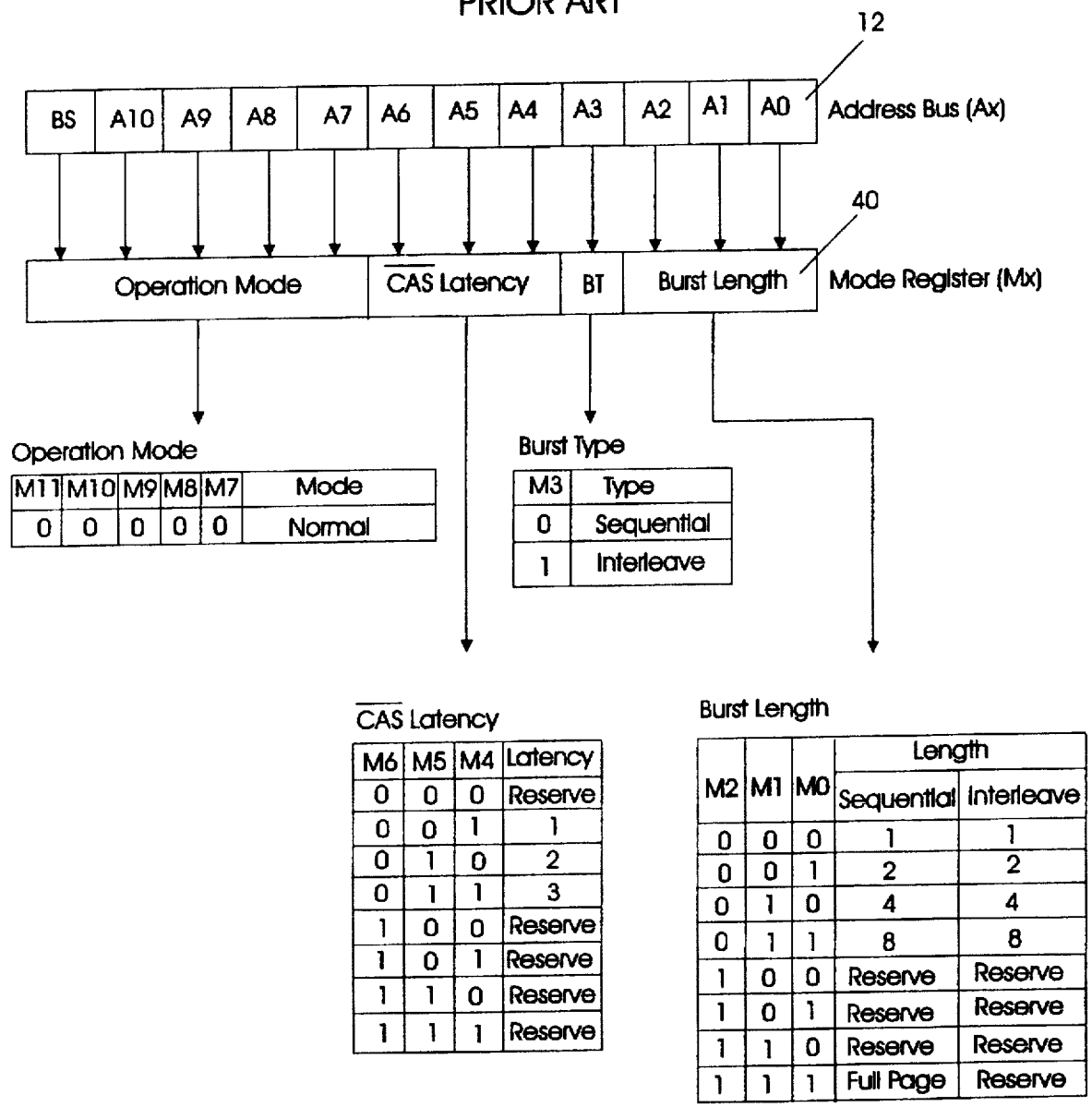
FIG. 2 is exemplary of address inputs used in conjunction with a programming of a mode register of a known SDRAM.
Figures 3, 3A:
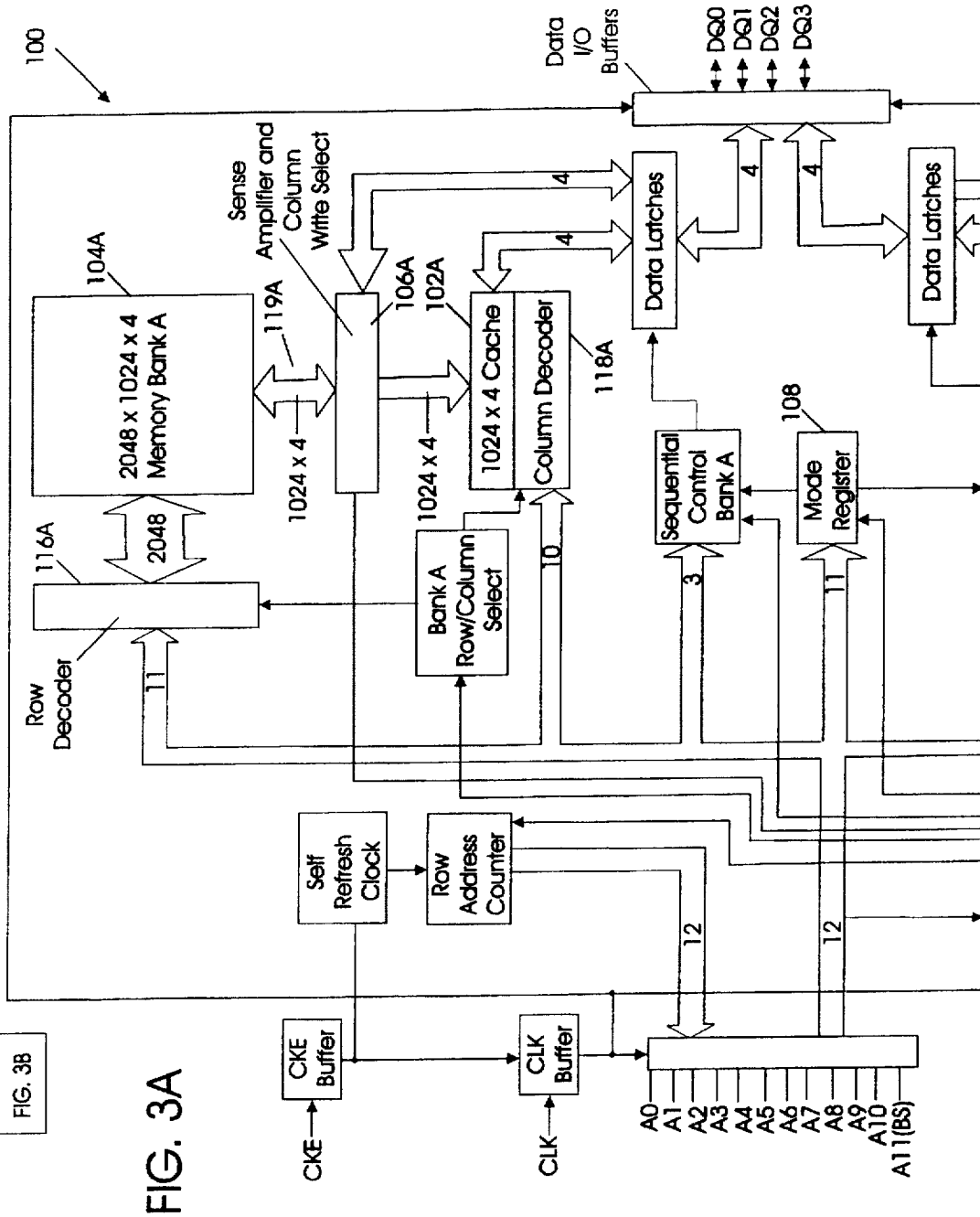
FIG. 3 shows a block diagram of a cached (2 Mbit×4 I/O×2 Bank)synchronous dynamic random access memory device according to the present invention.
Figure 3B:
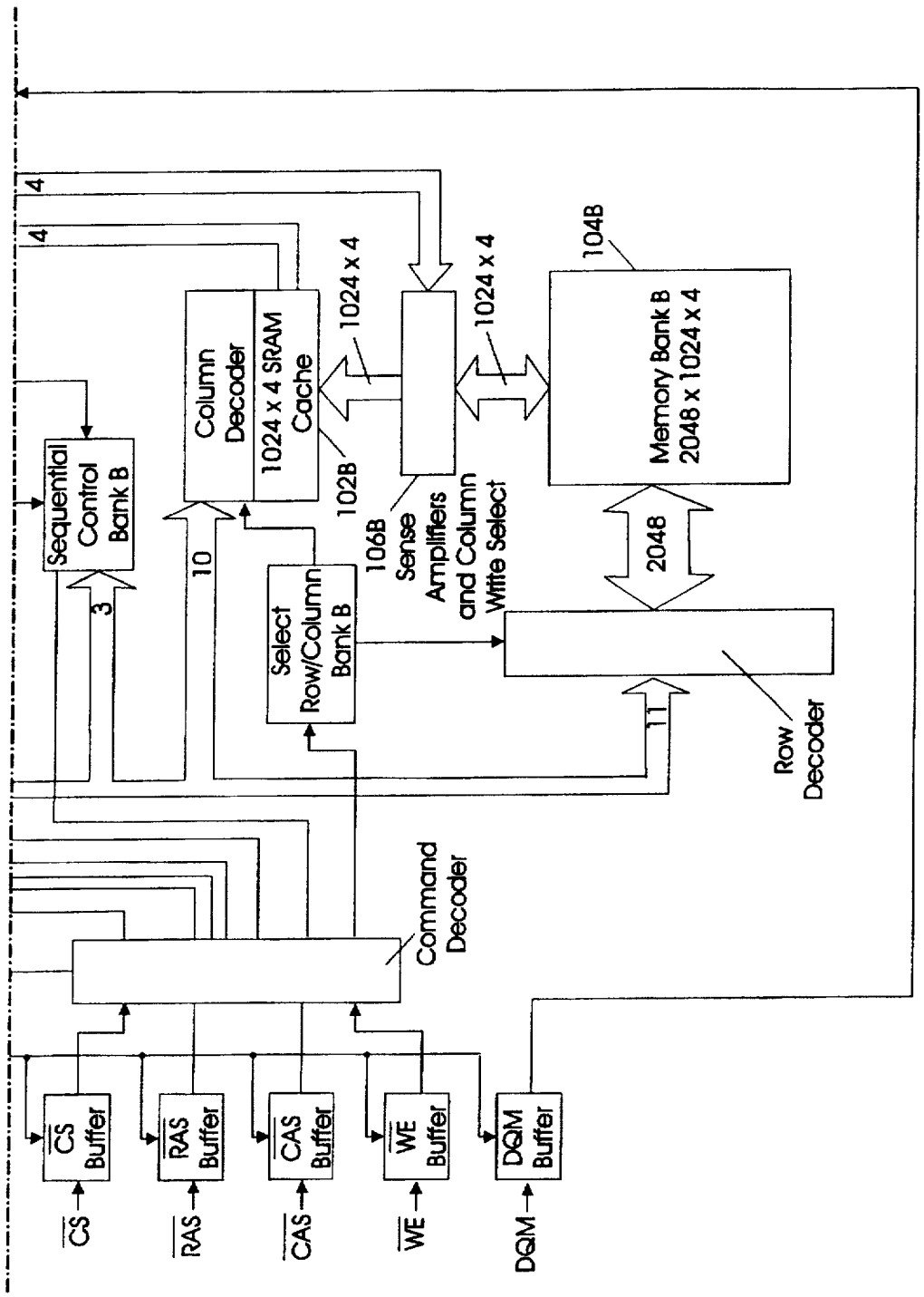

Referring now to FIG. 3, a block diagram of a cached SDRAM 100 according to the present invention is shown. An 8 Kbit integrated cache 102 on the SDRAM 100 includes a 4 Kbit integrated static random access memory (row register) (102A, 102B) for each SDRAM bank (104A, 104B). As used in the following, the terms "cache," "integrated row register," and "static random access memory" are used interchangeably and shall be interpreted to mean a static random access memory. Furthermore, the discussion to follow shall refer to Bank A (104A) and the associated integrated row register 102A, however, the discussion is equally applicable to Bank B (104B) and the associated integrated row register 102B. Still further, the following detailed description of the present invention includes the use of the terms "hit" and "miss", which shall hereafter refer to a page of data contained in a row register (to be discussed further herein below). A "hit" occurs when the row being accessed is already in the row register, thus a new row of a memory bank array does not need to be accessed. A "miss" occurs when the row being accessed is not the one currently in the row register. A "miss" on a Write command may not affect the row register, while on the other hand a "miss" on a Read command causes the new row to be loaded into the row register. The content of the row register is always equal to the last row Read from the SDRAM array as modified by any Writes that may have occurred in an interim period.

When a row of the SDRAM Bank A is activated, the row data is latched by the associated sense amplifiers 106A, but does not get directly transferred into the cache 102A. This allows the SDRAM array 104A to be refreshed or a new row access to be initiated without modifying the current contents of the cache 102A. However, when a Read command occurs after a new row has been activated, the entire row is automatically transferred into the cache 102A where it is then read from the chip 100 within the specific CAS Latency. In accordance with the invention, all Read commands synchronously retrieve data from the SDRAM array (104A, 104B) and through the SRAM cache (102A, 102B) and do not directly access the SDRAM array (104A, 104B), as will be discussed further herein below with reference to a "Write Transfer" mode and a "No Write Transfer" mode.

In accordance with one aspect of the present invention, the cached SDRAM architecture improves system performance by reducing the latency of the memory, in addition to allowing the system to perform concurrent operations on a same bank of DRAM memory. Since Reads always access the cache according to the present invention, and Write data is buffered, the cached SDRAM is able to perform random column access at SRAM speeds.

Using the row register (102A, 102B), the cache SDRAM of the present invention is able to perform concurrent operations to the same bank (104A, 104B, respectively). This ability to perform concurrent operations provides a significant increase in the performance of the memory, in some instances, effectively doubling a memory's bandwidth over that of a standard SDRAM (See FIG. 10).

Figure 4:
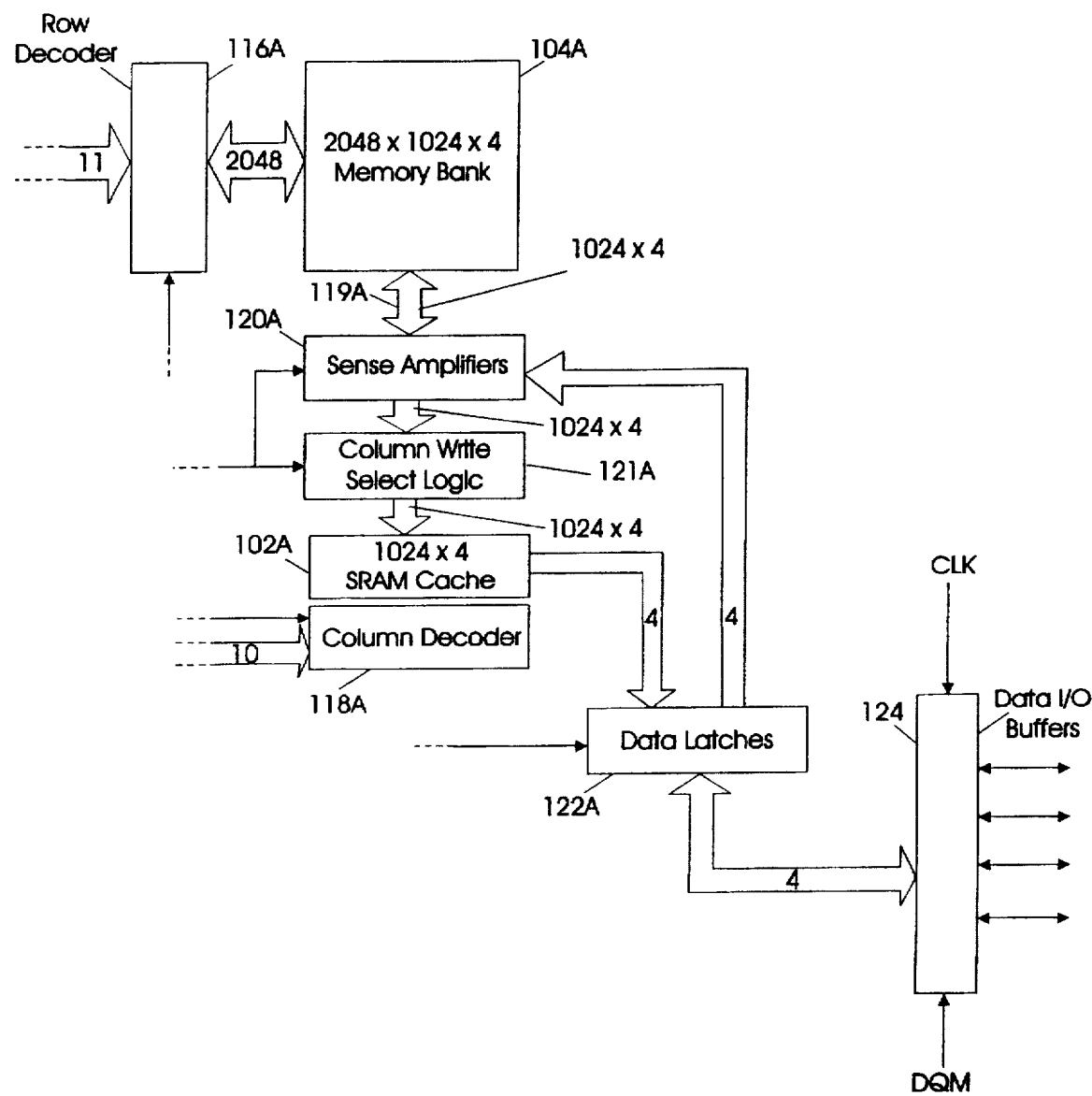
FIG. 4 illustrates a portion of the cached SDRAM according to the present invention as shown in the block diagram of FIG. 3 in greater detail.

Referring now to FIGS. 3 and 4, a cached synchronous dynamic random access memory (cached SDRAM) device 10 having a multi-bank architecture includes a synchronous dynamic random access memory (SDRAM) bank including a row decoder 116A coupled to a memory bank array 104A for selecting a row of data in the memory bank array. Sense amplifiers 120A are coupled to the memory bank array 104A via bit lines 119A for latching the row of data selected by the row decoder 116A. A column decoder 118A is provided for selecting a desired column of the row of data. A row register 102A is provided for storing a row of data latched by the sense amplifiers 120A. The column decoder 118A of the SDRAM is further for selecting a desired column of the row of data stored by the row register 102A.

A select logic gating means, disposed between the sense amplifiers 120A and the row register 102A is provided for selectively gating the row of data present on the bit lines 121A to said row register 102A in accordance a particular memory operation of the cached SDRAM 100 being performed. Select logic gating means 121A includes appropriate logic circuitry for performing a desired gating of a row of data from the sense amplifiers 120A to the row register 102A. Data to be input into cached SDRAM 100 during a Write operation is received by the sense amplifiers 120A and written into the memory bank array 104A. In addition, data to be output from cached SDRAM 100 during a Read operation is read out only from the row register 102A, the row of data contained in the row register 102A first having been read from the memory bank array 104A to the sense amplifiers 120A and then selectively gated to the row register 102A in accordance with the particular synchronous memory operation. For instance, subsequent to a Read operation in which a row of data selected by the row decoder is gated into the row register 102A and upon an occurrence of a additional subsequent memory operation affecting the same row of data in the memory bank array (such as a Write operation), the select logic gating means 121A can gate the affected row of data present on the bit lines to the row register 102A, thereby maintaining a row data coherency.

In addition to the above, the cached SDRAM of the present invention further includes data input/output (I/O) buffers 124 having input lines for receiving the data to be input into and output from the cached SDRAM 100. Data latches 122A are coupled between the data I/O buffers 124 and the row register 102A for latching data output from the row register 102A onto the data I/O buffers 124. The data latches 122A further are coupled between the data I/O buffers 124 and the sense amplifiers 120A for latching data input from the data I/O buffers 124 to the sense amplifiers 120A. The data output from cached SDRAM 100, and more particularly row register 120A, is synchronous data synchronized with the external clock signal being applied to cached SDRAM 100.

A control means (not shown), such as a microprocessor or memory controller, can be used for controlling the cached SDRAM 100 for enabling concurrent memory operations to occur on the row register 102A and on a corresponding memory bank array of a same bank 104A of the multi-bank architecture. The control means can control the cached SDRAM 100 for enabling a Burst Read operation on the row register 102A and a bank Precharge operation on the memory bank array 104A of the same bank of the multi-bank architecture to occur concurrently. Alternatively, the control means can control the cached SDRAM 100 for enabling a Burst read operation on row register 102A and a bank activate operation on the corresponding memory bank array 104A of the same bank of the multi-bank architecture to occur concurrently. The control means may further control the cached SDRAM 100 for enabling a Burst read operation on the row register 102A and a bank refresh operation on the corresponding memory bank array 104A of the same bank of the multi-bank architecture to occur concurrently.

The cached SDRAM 100 of the present invention further includes a second synchronous dynamic random access memory (SDRAM) bank including a second row decoder coupled to a second memory bank array for selecting a second row of data in the second memory bank array, second sense amplifiers coupled to the second memory bank array via second bit lines for latching the row of data selected by the second row decoder, and a second column decoder for selecting a desired column of the row of data. A second randomly addressable row register stores a row of data latched by the second sense amplifiers. A second select logic gating means, integrated with the sense amplifiers, as 106B, is disposed between the second sense amplifiers and the second row register 102B, for selectively gating the row of data present on the second bit lines to the row register 102B in accordance to particular memory operations of the cached SDRAM being performed. Data to be input into the second bank of the cached SDRAM 100 during a Write operation is received by the second sense amplifiers 106B and written into the second memory bank array 104B. Data to be output from the second bank of the cached SDRAM during a Read operation is read out only from the second row register 102B, the row of data contained in the second row register 102B first having been read from the second memory bank array 104B to the second sense amplifiers and then selectively gated to the second row register 102B in accordance with the particular synchronous memory operations.

Figure 7:
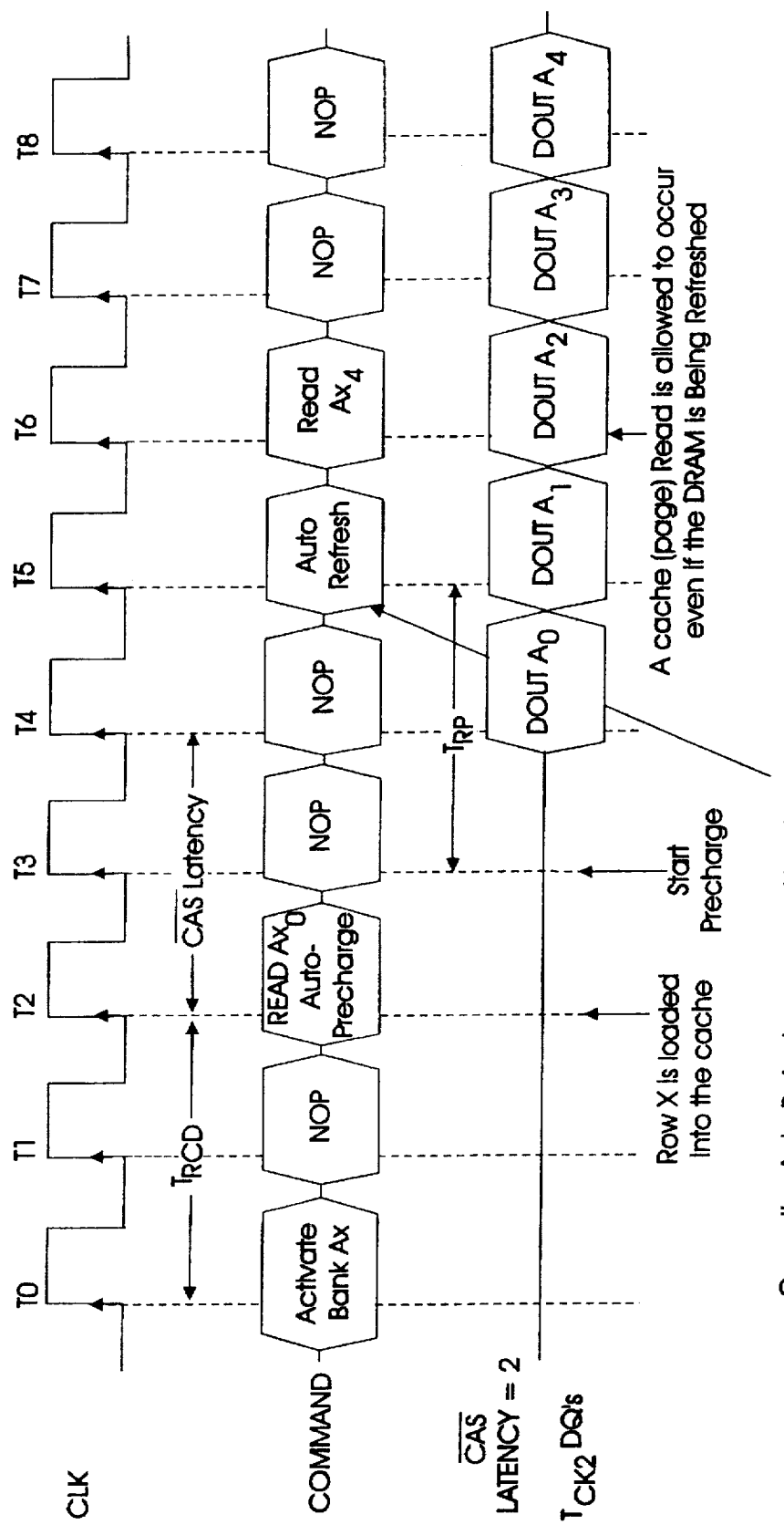
FIG. 7 shows an example of an Auto Refresh command during cache (page) reads (burst length=4, CAS latency=2)
Figure 8:
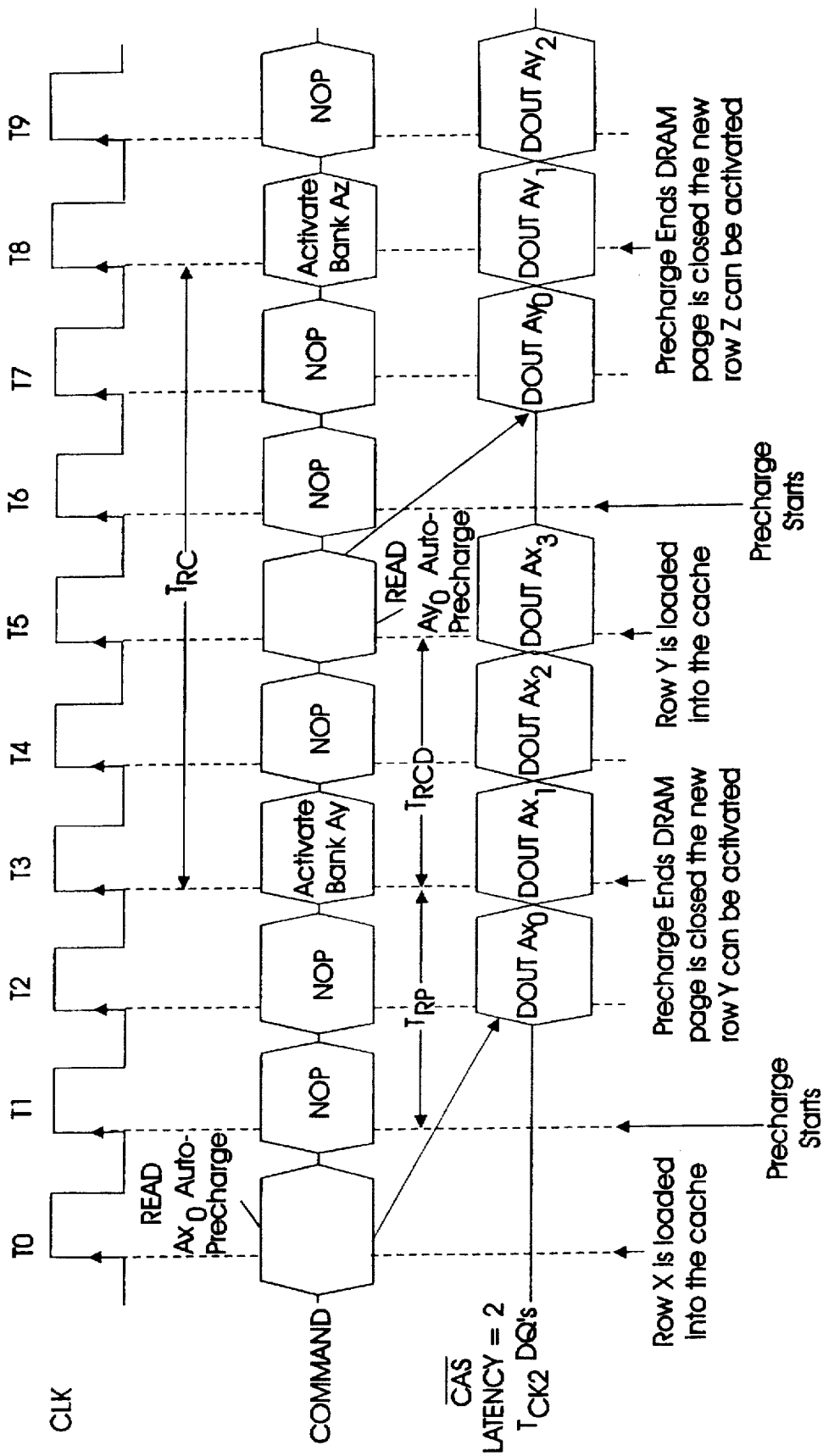
FIG. 8 shows an example of a Read followed by a Read miss (burst length=4, CAS latency=2)
Figure 9:
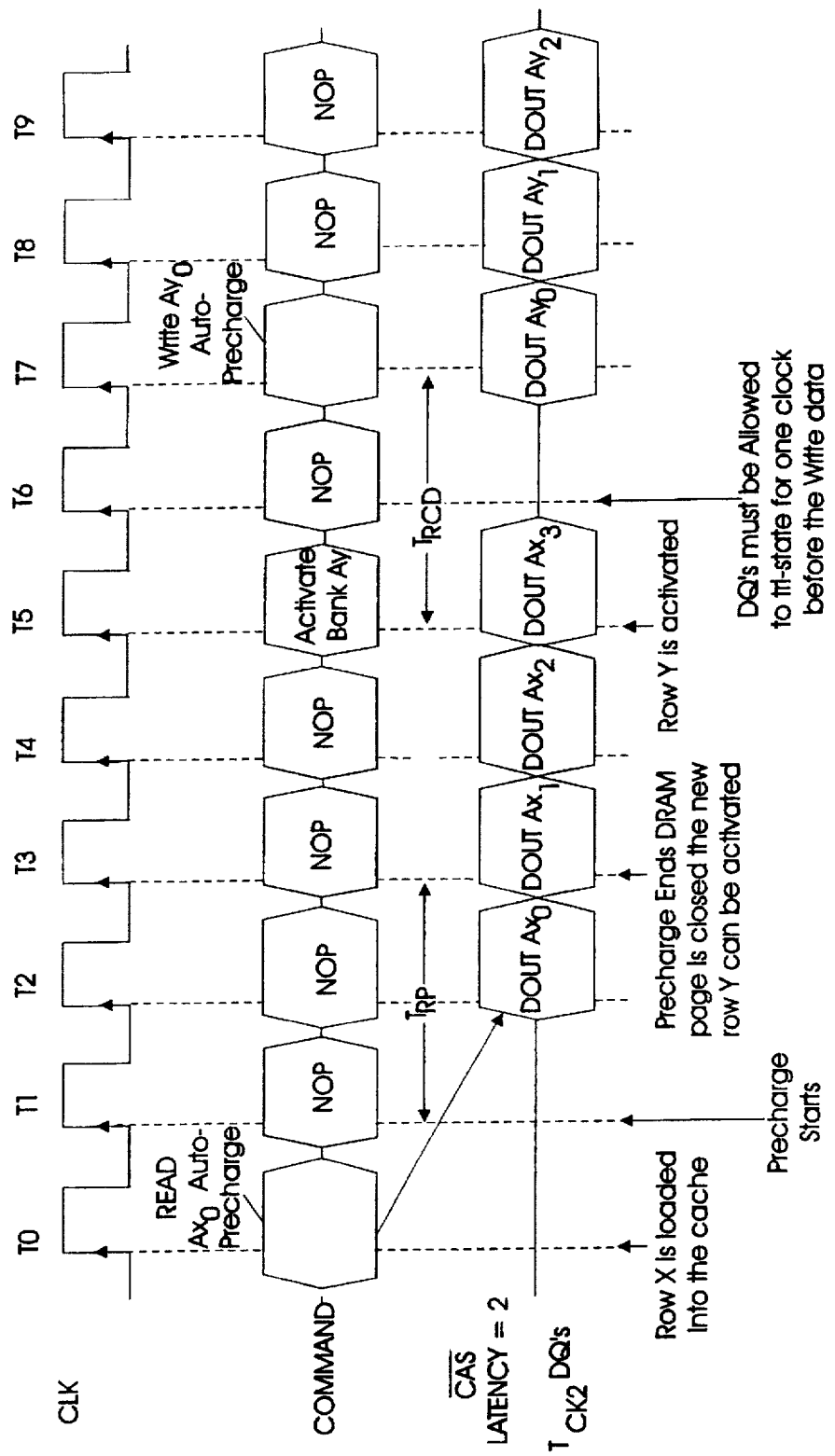
FIG. 9 shows an example of a Read miss followed by a Write miss (burst length=4, CAS latency=2).

With reference to FIGS. 7, 8 and 9, the following is a discussion on which concurrent operations are allowed and how they can be used to maximize memory performance and minimize system waits states.

Referring now to FIG. 7 (in conjunction with FIGS. 3, 4 and 5) when a Bank Activate command is given to the cached SDRAM, the row is selected in memory and the data is latched by the sense amplifiers 106A. At this point the contents of the cache 102A remain unchanged. When a Read command is issued, the entire selected row is transferred into the cache 102A within one clock cycle and the first Read data appears on the outputs within two clock cycles. On the clock cycle following the Read command, the row data is latched in both the cache 102A and the sense amplifiers 106A. Since all Reads retrieve data from the cache 102A and do not access the array 104A, the DRAM array 104A no longer needs to be held open. As a result, the DRAM array 104A can be precharged on the clock cycle following the Read command using the auto-precharge function (Read with Auto-Precharge). The manual Precharge command cannot be used at this time because it would terminate the burst Read. Note that Manual Precharge termination of a burst is implemented with the cached SDRAM of the present invention in order to maintain a backward compatibility with standard SDRAMs. To allow the burst to complete, the Manual Precharge Command can be given two clock cycles before the end of the Read burst. Once the SDRAM array 104A has been precharged, the system (not shown) can issue the Auto Refresh command (Time T5 of FIG. 7) and/or another Bank Activate command to the same or different Bank during cache (i.e., page) Read accesses.

The ability of the cached SDRAM to perform a Bank Activate during a cache (page) Read gives the system the option to pipeline memory accesses to the same bank. This is accomplished by a controller closing the open page and then starting a next row access (to the same page) while bursting out Read data from the previous row held in the cache (FIG. 8). Using pipelining, the precharge time and the $t_{RCD}$ of a page miss can be completely hidden during a Read burst as well as a portion of the CAS Latency. This is a very powerful feature of the cached SDRAM 10, and in the case of random row Reads, pipelining can more than double the bandwidth of the memory (See FIG. 10). The row cache can also be used to hide some of the latency of a Write miss cycle following a Read cycle as shown in FIG. 9.

Figure 10B:
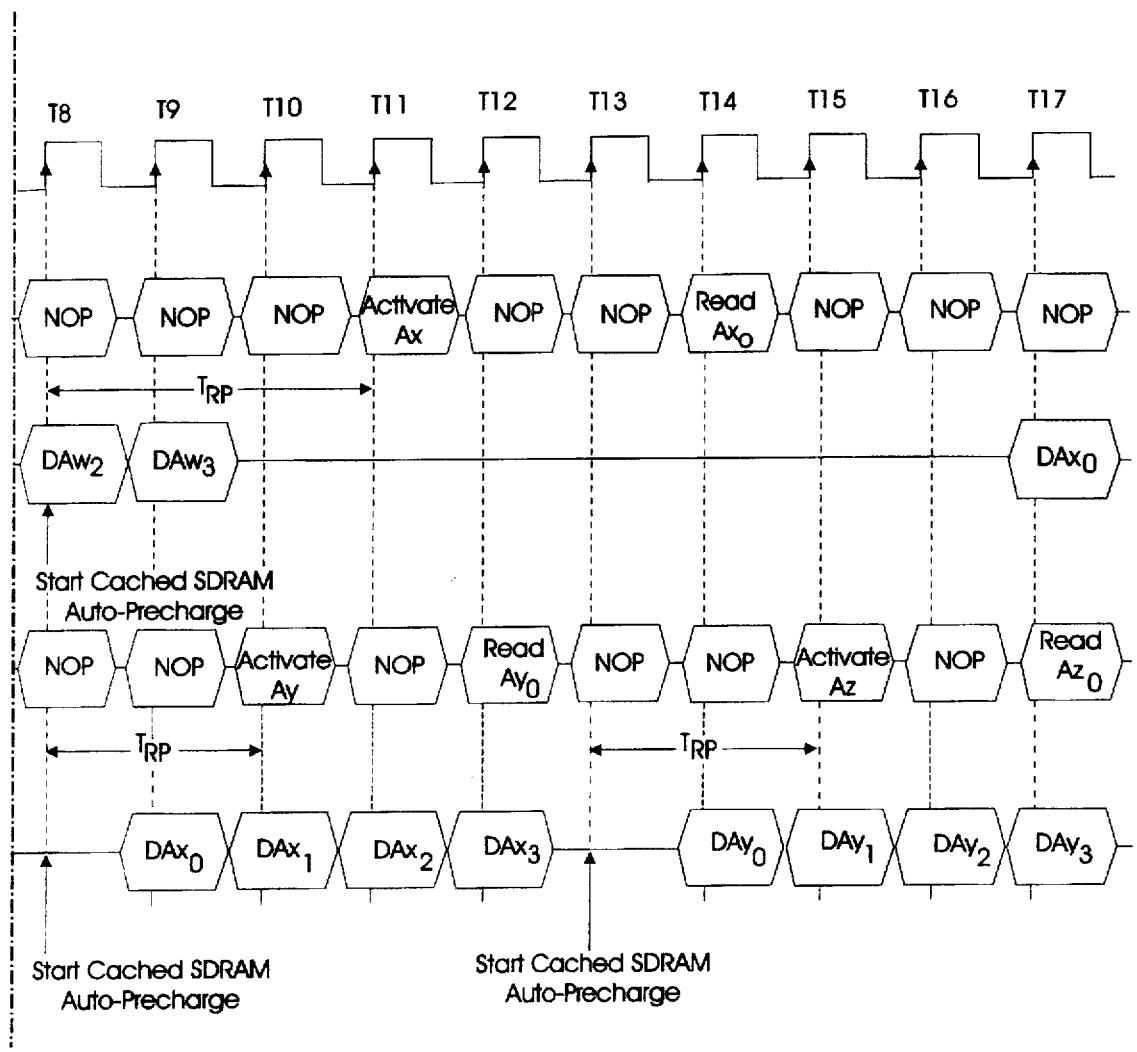
FIG. 10 is illustrative of a comparison of timing diagrams of a standard SDRAM versus a cached SDRAM according to the present invention for random row reads to the same bank.

Combining the reduced latency of the cached SDRAM with the capability of overlapping memory access cycles gives the cached SDRAM a significant performance advantage over standard SDRAM (see FIG. 10). That is, the cached SDRAM can reduce the latency of a Read page miss to that of a Read page hit, thereby more than doubling the performance of the memory over a SDRAM operating at the same clock frequency. It should be noted that Write bursts cannot be pipelined due to the fact that a DRAM must be held open and cannot be precharged during a Write cycle until the last bit of input data is properly stored in the memory cell.

Turning once again to FIGS. 3–6, the row data from the DRAM sense amplifiers (106A, 106B) is transferred into the cache (102A, 102B) only on a first Read or Write command (and with respect to the Write command, only in the instance of the chip being in the Write Transfer mode) occurring after a Bank Activate command. Any subsequent Read or Write commands to the same row do not load the cache (102A, 102B) and the cache contents remain unchanged. In other words, multiple reads to a same row does not cause reloading of the cache each time.

In accordance with another embodiment of the present invention, the cached synchronous dynamic random access memory (cached SDRAM) device 100 having a multi-bank architecture and a programmable caching policy includes a synchronous dynamic random access memory (SDRAM) bank including a row decoder 116A coupled to a memory bank array 104A for selecting a row of data in the memory bank array 104A, sense amplifiers 120A coupled to the memory bank array 104A via bit lines 121A for latching the row of data selected by the row decoder 116A, and a column decoder 118A for selecting a desired column of the row of data. A randomly addressable row register 102A stores a row of data latched by the sense amplifiers 120A. A select logic gating means 121A is disposed between the sense amplifiers 120A and the row register 102A for selectively gating the row of data present on the bit lines 121 to row register 102A in accordance a particular synchronous memory operation of the cached SDRAM 100 being performed. Data to be input into cached SDRAM 100 during a Write operation is received by the sense amplifiers 120A and written into the memory bank array 104A. Data to be output from cached SDRAM 100 during a Read operation is read out only from the row register 102A, the row of data contained in row register 102A first having been read from the memory bank array 104A to the sense amplifiers 120A and then selectively gated to the row register 102A in accordance with the particular memory operation. The column decoder 118A of the SDRAM is further provided for selecting a desired column of the row of data stored by the row register 102A. Subsequent to a Read operation in which a row of data selected by the row decoder is gated into row register 102A, and upon an occurrence of a additional subsequent memory operation affecting the same row of data in the memory bank array, select logic gating means 121A gates the affected row of data present on the bit lines to the row register 102A, thereby maintaining a row data coherency.

A means 108 is provided for programming of the cached SDRAM 100 to operate in a Write Transfer mode (i.e., Write Allocate mode) corresponding to a Normal Operation mode of an industry standard SDRAM during a Write cycle, and to operate in a No Write Transfer mode (i.e., a No Write Allocate mode) according to an alternate operation mode during a Write cycle, thereby operating under a first and a second caching policy, respectively. Preferably, the programming means includes the mode register 108, as shall be discussed further herein below with reference to FIGS. 5 and 6. Alternatively, the programming may also be accomplished through other means such as a wirebond or metal mask option.

Select logic gating means 121A is responsive to a control signal from programming means 108A, wherein during the Write Transfer mode and upon an occurrence of a Write command, the caching policy is such that select logic gating means 121A automatically loads a previously activated row from the SDRAM array 104A into the row register 102A. Furthermore, during the No Write Transfer mode and upon an occurrence of a Write command, the caching policy is such that the select logic gating means 121A does not transfer a previously activated row to the row register 102A, where in the latter instance, the row register 102A functions as an independent cache Read bank and the SDRAM array 104A functions as a semi-independent DRAM Write bank.

The cached SDRAM 100 can further include a second synchronous dynamic random access memory (SDRAM) bank including a second row decoder coupled to a second memory bank array for selecting a second row of data in the second memory bank array, second sense amplifiers coupled to the second memory bank array via second bit lines for latching the row of data selected by the second row decoder, and a second column decoder for selecting a desired column of the row of data. A second randomly addressable row register is provided for storing a row of data latched by the second sense amplifiers. Furthermore, a second select logic gating means, disposed between the second sense amplifiers and the second row register, is provided for selectively gating the row of data present on the second bit lines to said row register in accordance a particular memory operation being performed. Data to be input into the second SDRAM during a Write operation is received by the second sense amplifiers and written into the second memory bank array. Data to be output from the second SDRAM during a Read operation is read out only from the second row register, the row of data contained in the second row register first having been read from the second memory bank array to the second sense amplifiers and then selectively gated to the second row register in accordance with the particular memory operation.

In accordance with another aspect according to the present invention, a method of implementing a programmable caching policy on a cached synchronous dynamic random access memory (cached SDRAM) device having a multi-bank architecture includes the steps of:

providing a synchronous dynamic random access memory (SDRAM) bank including a row decoder coupled to a memory bank array for selecting a row of data in the memory bank array, sense amplifiers coupled to the memory bank array via bit lines for latching the row of data selected by the row decoder, and a column decoder for selecting a desired column of the row of data;

providing a randomly addressable row register (ROW REGISTER) for storing a row of data latched by the sense amplifiers;

providing a select logic gating means, disposed between the sense amplifiers and said row register, for selectively gating the row of data present on the bit lines to the row register in accordance a particular synchronous memory operation of the cached SDRAM being performed, wherein data to be input into the cached SDRAM during a Write operation is received by the sense amplifiers and written into the memory bank array and wherein data to be output from the cached SDRAM during a Read operation is read out only from the row register, the row of data contained in the row register first having been read from the memory bank array to the sense amplifiers and then selectively gated to the row register in accordance with the particular synchronous memory operation; and programming of the cached SDRAM to operate in a Write Transfer mode corresponding to a Normal Operation mode of an industry standard SDRAM during a Write cycle, and to operate in a No Write Transfer mode during a Write cycle thereby operating under a first and a second caching policy, respectively.

In addition, the method further includes providing the select logic gating means for being responsive to a control signal from the programming means, wherein during the Write Transfer mode and upon an occurrence of a Write command, the caching policy is such that the select logic gating means automatically loads a previously activated row from the SDRAM array into the row register. Furthermore, during the No Write Transfer mode and upon an occurrence of a Write command, the caching policy is such that the select logic gating means does not transfer a previously activated row to the row register, where in the latter instance, the row register functions as an independent cache Read bank and the SDRAM array functions as a semi-independent DRAM Write bank. Still further, the method includes a step wherein subsequent to a Read operation in which a row of data selected by the row decoder is gated into the row register, and upon an occurrence of a additional subsequent memory operation affecting the same row of data in the memory bank array, the select logic gating means gates the affected row of data present on the bit lines to the row register, thereby maintaining a row data coherency.

The programmable caching policy method in accordance with the present invention can further comprise providing a second synchronous dynamic random access memory (SDRAM) bank including a second row decoder coupled to a second memory bank array for selecting a second row of data in the second memory bank array, second sense amplifiers coupled to the second memory bank array via second bit lines for latching the row of data selected by the second row decoder, and a second column decoder for selecting a desired column of the row of data. A second randomly addressable row register is provided for storing a row of data latched by the second sense amplifiers. A second select logic gating means, disposed between the second sense amplifiers and the second row register, is provided for selectively gating the row of data present on the second bit lines to the row register in accordance a particular synchronous memory operation being performed. Data to be input into the second SDRAM during a Write operation is received by the second sense amplifiers and written into the second memory bank array. Alternatively, data to be output from the second SDRAM during a Read operation is read out only from the second row register, the row of data contained in the second row register first having been read from the second memory bank array to the second sense amplifiers and then selectively gated to the second row register in accordance with the particular synchronous memory operation.

Figure 6:
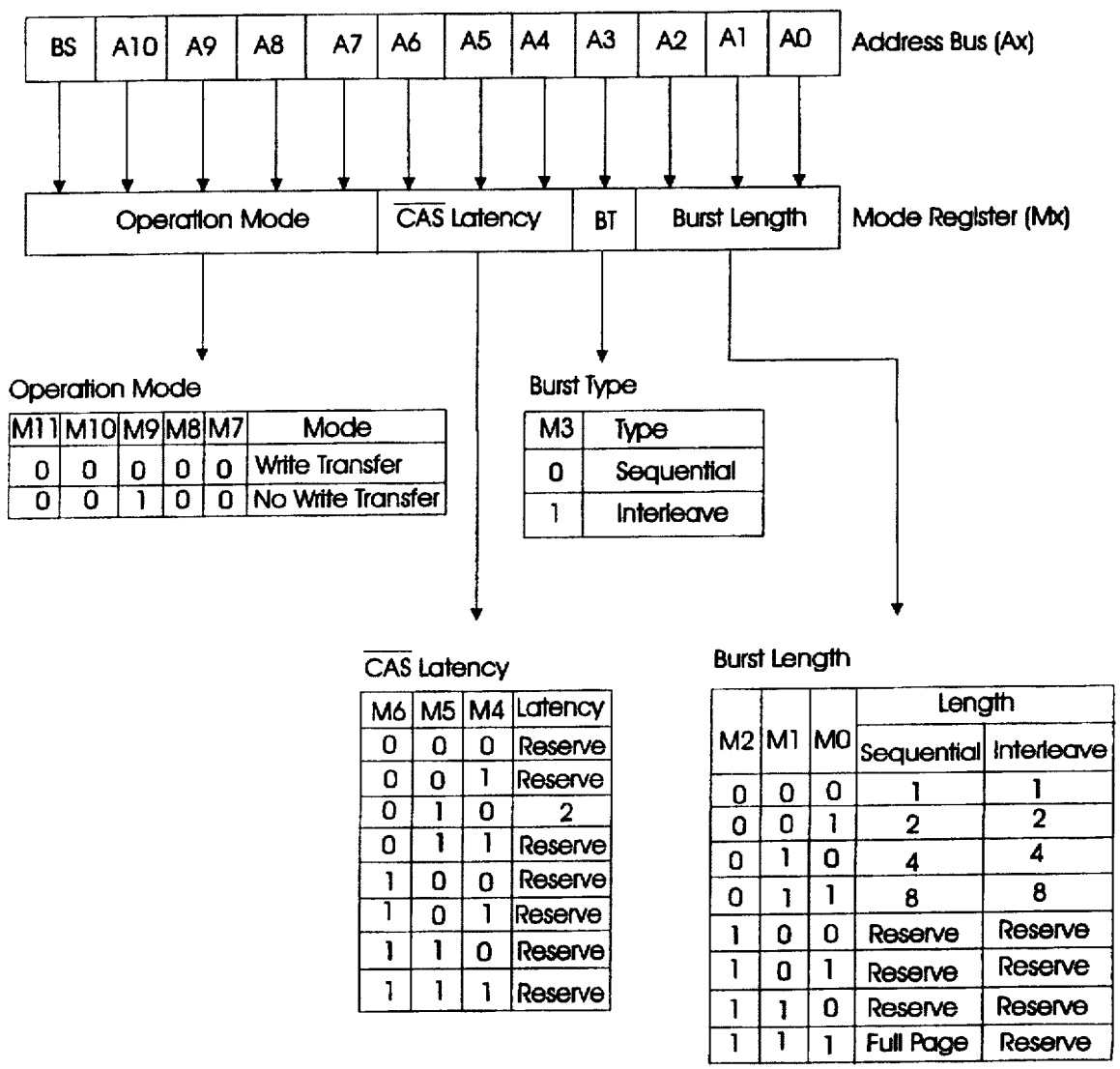
FIG. 6 is exemplary of address inputs used in conjunction with a programming of a mode register of a cached SDRAM in accordance with the present invention.

In further discussion of the Write Transfer mode and the No Write Transfer mode of operation, the present invention incorporates a programmable caching policy for providing a maximum device flexibility. This feature allows an cached SDRAM user to optimize the cached SDRAM's cache for a particular application, resulting in obtaining an optimal memory performance and compatibility. With respect to the present invention, the mode register 108, as shown in FIGS. 3 and 6, is preferably used for selecting whether the Write Transfer mode or the No Write Transfer mode of operation shall be used in a particular application. During a Mode Register Set cycle, the Normal/Write Allocate (Write Transfer) mode or the No Write Allocate (No Write Transfer) mode is selected based upon the content of address lines A7-A11 as shown in FIG. 6.

If a Write command occurs after a new row activate, the Mode Register 108 is queried to determine whether or not the data from the sense amplifiers (106A, 106B) are to be loaded into the cache (102A, 102B) i.e., whether or not to transfer wordline data from the sense amplifiers to the cache. If the Mode Register 108 indicates that the cached SDRAM 100 chip is in a Write Transfer mode, a Write command causes the sense amplifier data to be loaded from the SDRAM array (104A, 104B) into the cache (102A, 102B). If the mode register 108 indicates that the cached SDRAM 100 chip is in a No Write Transfer mode, a Write command does not cause an automatic transfer of the sense amplifier data into the cache (102A, 102B). If a Write hit occurs (i.e., the Write page is already in the cache), the cached SDRAM 100 will automatically update the cache, as the data is written to the DRAM array (104A, 104B). (See FIGS. 5 and 6).

In an instance in which the cached SDRAM is used in the Write Transfer (Normal) mode, a Write miss will cause a new row of data to be activated and transferred from the SDRAM array (104A, 104B) into the cache (102A, 102B) overwriting any previous information stored in the cache (102A, 102B). Since Read operations always load the cache (102A, 102B), the row data in the SDRAM sense amplifiers (106A, 106B) will always equal the cache data after a Read or a Write command is given. Therefore, in Write Transfer mode, only one DRAM cache row per bank (104A, 104B) is available for reading or writing (See FIG. 5).

Referring again to FIG. 7, a more detailed discussion of the Write Transfer mode shall be given. When a Read miss occurs, a Bank Activate command must be issued for a new row. After a time $t_{RCD}$, a Read command or a Read with Auto Precharge command can be given to the cached SDRAM in order to access data from the new row. When the Read command is issued at time T0, data from row X is transferred from the SDRAM bank into the cache on a same clock cycle. If the Auto Precharge function is invoked, the DRAM precharge is started on the clock cycle following the Read command. Two clock cycles later, the SDRAM bank is closed or precharged and a new row Y from the same bank can be activated (clock time T3). When a Write command is issued a time T5, the cached SDRAM transfers sense amplifier data (row Y) into the cache. At this point, both the SDRAM sense amplifiers and the cache are holding the same information (row Y). Any subsequent Read command will read row Y column data from the cache (see times T7-T9 of FIG. 7). Similarly, any subsequent Write command will simultaneously write data to row Y being held in the sense amplifiers and also update row Y in the cache.

Since the SDRAM sense amplifiers 102A and the cache 106A will always hold the same row after a Read or Write command is issued, a memory controller (not shown) would require only one page tag per bank of the cached SDRAM. This is the same number of page tags per bank required for an industry standard SDRAM. In addition, the control of the SDRAM/cache bank (104A, 102A) would be identical to the control of a standard SDRAM's DRAM bank. For further compatibility with a standard SDRAM, the binary code of the Write Transfer mode corresponds to the code for the Normal Operation mode of an industry standard SDRAM (See FIG. 6). These features help make the cached SDRAM 100% (one hundred percent) compatible with a SDRAM, allowing the cached SDRAM to replace a standard SDRAM without making any modifications to an existing memory controller and system (not shown).

Figure 5:
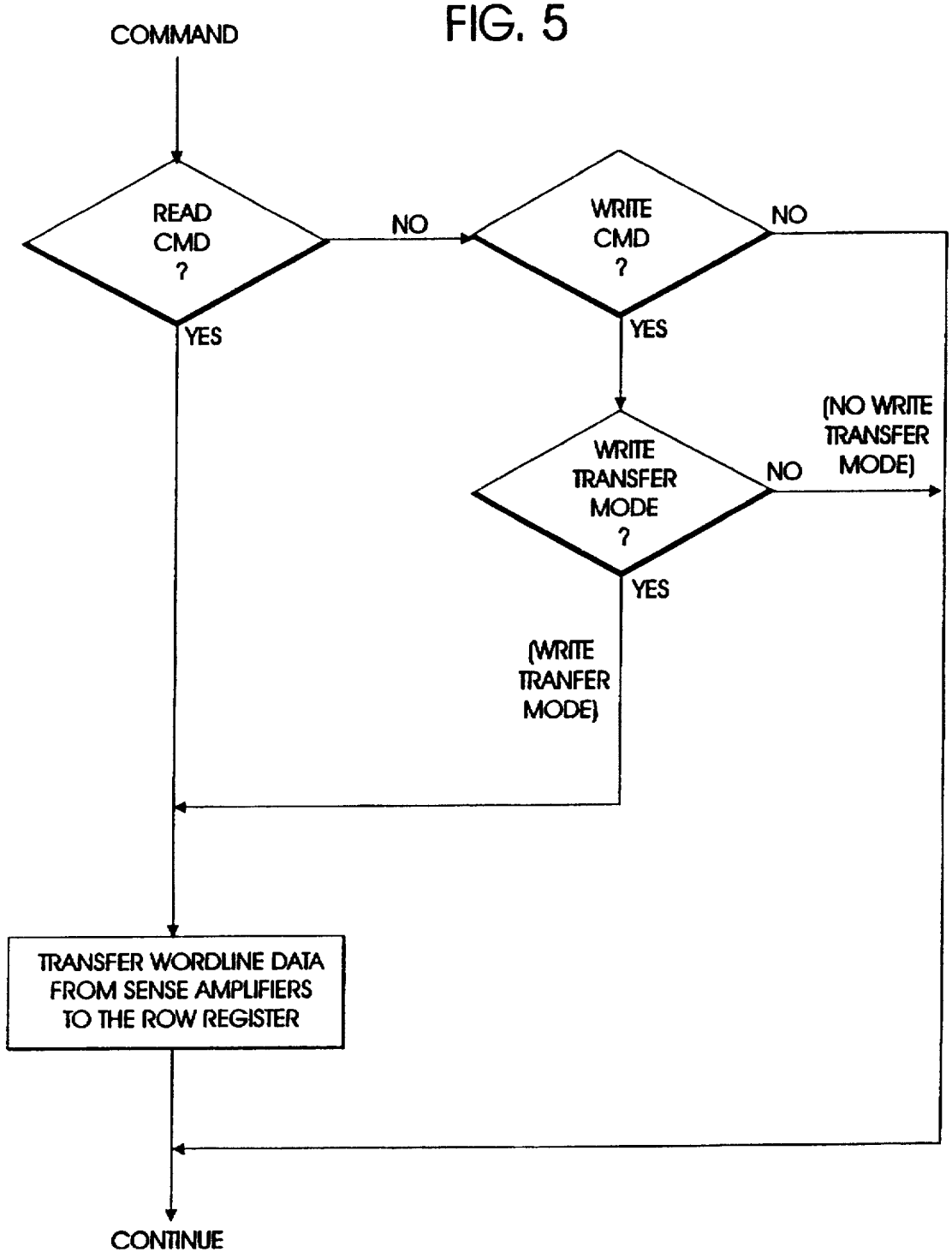
FIG. 5 illustrates a flow diagram for explanation of a portion of the programmable caching policy in accordance with the present invention.

When the cached SDRAM is placed in the No Write Transfer mode, a Write miss will not transfer a new row into the cache (See FIG. 5). Instead, the new row is updated in the DRAM sense amplifiers, thereby, leaving the cache contents unaffected. This advantageously allows the cached SDRAM to have a Read page and a Write page open simultaneously in the same DRAM bank.

Referring again to FIG. 8, the No Write Transfer mode shall be further discussed. When a Read miss occurs, a Bank Activate command must be issued to activate a new row. After a time $t_{RCD}$, a Read command can be given to the cached SDRAM in order to access data from the new row. When the Read command is issued at time T0, data from row X is transferred from the SDRAM into the cache on the same clock cycle. If the Auto Precharge function is invoked, the SDRAM precharge is started on the clock cycle following the Read command. Two clock cycles later, the SDRAM bank is closed and the new row Y can be activated. When a Write command is issued a time T5, the cached SDRAM does not load the row Y into the cache. Instead, the Write data is used to update the SDRAM sense amplifiers 106A and the cache 102A remains unaffected. At this point, there are two rows (row X and row Y) open in the bank from which column Reads/Writes can occur. Any subsequent Read command will read column data from row X in the cache (see time T7-T9 in FIG. 8). Similarly, any subsequent Write command will write data to row Y in the SDRAM. Data cannot be read from the row Y unless the SDRAM is precharged and row Y is reactivated, followed by a Read command. Similarly, data cannot be written to row X unless the SDRAM is precharged and row X is reactivated, followed by a Write command.

The above discussed No Write Transfer mode setup is ideal for a system (not shown) that reads data from one page of memory, processes the data, and then writes the results back to a different page of the memory. In this case, the cached SDRAM can have both the Read page and the Write page open simultaneously in the same bank. Additionally, any application in which data copy or data move operations occur frequently could advantageously encounter a performance benefit using the No Write Transfer mode of the cached SDRAM according to the present invention.

The cached SDRAM 100 thus represents an evolutionary improvement to a SDRAM. For instance, the design of the cached SDRAM 100 has been implemented in such a way as to maintain a backward compatibility with industry standard SDRAMs (e.g. 16 Mbit SDRAM). The cached SDRAM 100 of the present invention maintains a backwards compatibility with SDRAM by: (i) supporting the SDRAM command, address and data setup/hold times; (ii) using the same pin out and packages as industry standard 16 Mbit SDRAMs; (iii) using the same command definitions, command sequence, and truth table as an SDRAM; and, (iv) providing support for CAS Latency of 3 operation at all frequencies of operation. To elaborate briefly on point (iv), the cached SDRAM can operate with frequencies ranging from 83 MHz to 133 MHz with a CAS Latency of 2. Standard SDRAMs require a CAS Latency of 3 to operate at all of these frequencies. As a result, a given cached SDRAM will support both a CAS Latency of 2 and 3 operation at its operating frequency. For example, a 100 MHz CAS Latency cached SDRAM part will operate with 100 MHz CAS Latency 3 SDRAM controls. However, the performance of the cached SDRAM will be the same as an SDRAM in this situation if the SDRAM control does not take advantage of any of the performance improvements of the cached SDRAM.

From a functionality point of view, the cached SDRAM according to the present invention can be made plug-compatible with a standard SDRAM. Furthermore, it can be programmed as indicated herein for operating like a standard SDRAM when given SDRAM control signals.

As discussed herein, the cached SDRAM advantageously solves performance limitations of a standard SDRAM. For example, the cached SDRAM reduces the column latency of a standard SDRAM by having all Read operations occur from the row register. In addition, the cached SDRAM increases memory performance by supporting concurrent operations on the same bank. Thus a user is allowed to pipeline accesses and overlap commands in order to hide the latency of the SDRAM. These changes can lead to more than twice the memory performance over standard SDRAM at the same clock frequency (ad exemplified in FIG. 10). Again, the design of the cached SDRAM represents an evolutionary change that enables the user to fully utilize memory bandwidth and eliminate system wait states for all memory accesses.

While the invention has been particularly shown and described with reference to specific embodiments thereof, it will be understood by those skilled in the art that various changes in form and detail may be made thereto, and that other embodiments of the present invention beyond embodiments specifically described herein may be made or practiced without departing from the spirit and scope of the invention as claimed.

What is claimed is:

1. A cached synchronous dynamic random access memory (cached SDRAM) device having a multi-bank architecture, said cached SDRAM comprising:

- a synchronous dynamic random access memory (SDRAM) bank including a row decoder coupled to a memory bank array for selecting a row of data in the memory bank array, sense amplifiers coupled to the memory bank array via bit lines for latching the row of data selected by the row decoder, and a synchronous column select means for selecting a desired column of the row of data;

- a randomly addressable row register for storing a row of data latched by the sense amplifiers; and

- a select logic gating means, disposed between the sense amplifiers and said row register, for selectively gating the row of data present on the bit lines to said row register in accordance to particular industry standard synchronous memory operations of said cached SDRAM being performed, wherein data to be input into said cached SDRAM during a Write operation is received by the sense amplifiers and written into the memory bank array, wherein data to be output from said cached SDRAM during a Read operation is read out only from said row register, the row of data contained in said row register first having been read from the memory bank array to the sense amplifiers and then selectively gated to the row register in accordance with the particular industry standard synchronous memory operations, and wherein said row decoder, said memory bank array, said sense amplifiers, said synchronous column select means, said randomly addressable row register, and said select logic gating means are arranged so as to maintain backward compatibility with industry standard SDRAMs.

2. The cached SDRAM device of claim 1, further comprising:

synchronously operated data input/output (I/O) buffers having input lines for receiving the data to be input into said cached SDRAM; and synchronously operated data latches coupled between said data I/O buffers and said row register for latching data output from said row register onto said data I/O buffers, said synchronously operated data latches further being coupled between said data I/O buffers and the sense amplifiers for latching data input from said synchronously operated I/O buffers to the sense amplifiers.

3. The cached SDRAM device of claim 1, wherein the synchronous column select means of said SDRAM is further for selecting a desired column of the row of data stored by said row register.

4. The cached SDRAM device of claim 1, further comprising:

synchronous control means for controlling said cached SDRAM to enable concurrent synchronous memory operations to occur on said row register and on the corresponding memory bank array of a same bank of the multi-bank architecture.

5. The cached SDRAM device of claim 4, wherein said synchronous control means controls said cached SDRAM for enabling a Read operation on said row register and a bank Precharge operation on the memory bank array of the same bank of the multi-bank architecture to occur concurrently.

6. The cached SDRAM device of claim 4, wherein said synchronous control means controls said cached SDRAM for enabling a Read operation on said row register and a bank activate operation on the corresponding memory bank array of the same bank of the multi-bank architecture to occur concurrently.

7. The cache SDRAM device of claim 4, wherein said synchronous control means controls said cached SDRAM for enabling a Read operation on said row register and a bank refresh operation on the corresponding memory bank array of the same bank of the multi-bank architecture to occur concurrently.

8. The cached SDRAM device of claim 1, wherein subsequent to a Read command in which a row of data selected by the row decoder is gated into said row register, and upon an occurrence of a additional subsequent synchronous memory operation affecting the same row of data in the memory bank array, said select logic gating means gates the affected row of data present on the bit lines to said row register, thereby maintaining a row data coherency.

9. The cached SDRAM device of claim 1, further comprising:

a second synchronous dynamic random access memory (SDRAM) bank including a second row decoder coupled to a second memory bank array for selecting a second row of data in the second memory bank array, second sense amplifiers coupled to the second memory bank array via second bit lines for latching the row of data selected by the second row decoder, and a second synchronous column select means for selecting a desired column of the row of data;

a second randomly addressable row register for storing a row of data latched by the second sense amplifiers; and a second select logic gating means, disposed between the second sense amplifiers and said second row register, for selectively gating the row of data present on the second bit lines to said row register in accordance to particular industry standard synchronous memory operations of said cached SDRAM being performed, wherein data to be input into the said second SDRAM of said cached SDRAM during a Write operation is received by the second sense amplifiers and written into the second memory bank array, wherein data to be output from said second SDRAM of said cached SDRAM during a Read operation is read out only from said second row register, the row of data contained in said second row register first having been read from the second memory bank array to the second sense amplifiers and then selectively gated to the second row register in accordance with the particular industry standard synchronous memory operations, and wherein said second row decoder, said second memory bank array, said second sense amplifiers, said second synchronous column select means, said second randomly addressable row register, and said second select logic gating means are arranged so as to maintain backward compatibility with industry standard SDRAMs.

* * * * *

UNITED STATES PATENT AND TRADEMARK OFFICE
Certificate

Patent No. 5,787,457                                                             Patented: July 28, 1998

On petition requesting issuance of a certificate for correction of inventorship pursuant to 35 U.S.C. 256, it has been found that the above identified patent, through error and without deceptive intent, improperly sets forth the inventorship.

Accordingly, it is hereby certified that the correct inventorship of this patent is: Christopher P. Miller, Underhill, VT; Jim L. Rogers, Milton, VT; Steven W. Tomashot, Williston, VT; Oscar F. Jones, Jr., Colorado Springs, CO; David W. Bondurant, Colorado Springs, CO; Kenneth J. Mobley, Colorado Springs, CO.

Signed and Sealed this Twenty-First Day of March, 2000.

DO HYUN YOO  
                                                       Supervisory Patent Examiner,  
                                                                        Art Unit 2759